United States Patent
Watkins et al.

(10) Patent No.: US 10,312,888 B2
(45) Date of Patent: Jun. 4, 2019

(54) SYSTEMS AND METHODS FOR A ROBUST DOUBLE NODE UPSET TOLERANT LATCH

(71) Applicants: Adam Watkins, Carbondale, IL (US); Spyros Tragoudas, Carbondale, IL (US)

(72) Inventors: Adam Watkins, Carbondale, IL (US); Spyros Tragoudas, Carbondale, IL (US)

(73) Assignee: Board of Trustees of Southern Illinois University on Behalf of Southern Illinois University Carbondale, Carbondale, IL (US)

(*) Notice: Subject to any disclaimer, the term of this patent is extended or adjusted under 35 U.S.C. 154(b) by 0 days.

(21) Appl. No.: 16/110,137

(22) Filed: Aug. 23, 2018

(65) Prior Publication Data

US 2018/0367124 A1    Dec. 20, 2018

Related U.S. Application Data

(63) Continuation of application No. 15/706,445, filed on Sep. 15, 2017, now Pat. No. 10,084,435.

(60) Provisional application No. 62/394,786, filed on Sep. 15, 2016.

(51) Int. Cl.
| | | |
|---|---|---|
| *H03K 3/037* | (2006.01) | |
| *H03K 19/20* | (2006.01) | |
| *H03K 19/08* | (2006.01) | |

(52) U.S. Cl.
CPC .......... *H03K 3/0375* (2013.01); *H03K 19/08* (2013.01); *H03K 19/20* (2013.01)

(58) Field of Classification Search
None
See application file for complete search history.

(56) References Cited

U.S. PATENT DOCUMENTS

| | | | | |
|---|---|---|---|---|
| 7,482,831 | B2* | 1/2009 | Chakraborty | ........ H03K 3/0375 326/11 |
| 8,402,328 | B2* | 3/2013 | Wang | ............... G01R 31/31816 714/726 |
| 2006/0005091 | A1* | 1/2006 | Mitra | ............... G01R 31/31816 714/726 |
| 2013/0082757 | A1* | 4/2013 | Kobayashi | ........... H03K 3/0375 327/202 |

* cited by examiner

*Primary Examiner* — Minh D A
*Assistant Examiner* — James H Cho
(74) *Attorney, Agent, or Firm* — Polsinelli PC

(57) ABSTRACT

Various embodiments of a robust double node upset tolerant latch in which all internal and external nodes are capable of recovering the previous value after a single event upset are disclosed.

20 Claims, 11 Drawing Sheets

SYSTEMS AND METHODS FOR A ROBUST DOUBLE NODE UPSET TOLERANT LATCH

CROSS REFERENCE TO RELATED APPLICATIONS

This is a continuation application that claims priority to U.S. patent application Ser. No. 15/706,445 filed on Sep. 15, 2017 that claims priority from U.S. provisional application Ser. No. 62/394,786 filed on Sep. 15, 2016, which are incorporated by reference in their entireties.

FIELD

The present disclosure generally relates to latch design and in particular to systems and methods for a highly, robust double node upset tolerant latch.

BACKGROUND

As the transistor feature side continuously scales down to improve performance, modern circuitry continues to become more susceptible to radiation induced errors commonly referred to as a soft error. Soft errors can manifest from either neutron particles originating from space or alpha particles from packaging. A soft error occurs when an energetic particle hits the diffusion region of a reverse bias transistor. This, in turn, allows an "off" transistor to temporarily conduct current which can cause a voltage change in a node connected to the affected transistor. If the error occurs in combinational logic, the resulting voltage pulse may be stored in a connected flip flop thus causing an error. On the other hand, if the error occurs in memory or a latch during the hold phase, the stored data may change. To mitigate this effect, there is a need for design methodologies that reduce the vulnerability of circuitry to radiation effects.

Improving the reliability of latches may be an important element in mitigating the occurrence of these errors. There has been extensive research in the field of hardening latches against single event upsets (SEU). The simplest and most common design in safety critical applications is the triple modular redundancy (TMR) latch. This design consists of 3 standard latches connected to a 3-input majority voting circuit. While this design is robust against errors, it has the drawback of high area, delay and power consumption. For this reason there have been many other designs proposed that offer high SEU reliability with lower area, delay and power consumption. The first and most common cell is the DICE cell proposed in Calin et al. The design in Calin et al. consists of eight cross-coupled PMOS and NMOS transistors connected in series which forms four nodes. Due to the relatively high delay and power consumption of the DICE latch, there have been many other SEU tolerant latch designs proposed that provide reliability using blocking Muller C-elements, redundancy or delay in the feedback path.

In more recent times, the further reduction of the transistor feature size has increased the likelihood of a single event causing a transient on multiple nodes simultaneously, commonly referred to as a single event multiple upset (SEMU). This trend necessitates the development of new latch designs that are tolerant to multiple node strikes to guarantee reliability in current and future technologies. As in the SEU case, the goal of these designs are to minimize the power, delay and area overheads. However, contrary to the SEU case, the latches are designed to tolerate two simultaneous errors, commonly referred to as a double node upset (DNU). Currently there are many existing latch designs that are tolerant to DNUs which are discussed below.

Many modern circuit designs employ a technique commonly referred to as clock gating to further reduce the power consumption. Clock gating consists of setting the clock to a stable value or "gating" the clock. If clock gating is used with a latch, it may need to hold the current state for many clock cycles. In the presence of DNUs, this increases the likelihood of multiple errors occurring during the hold phase. In many existing DNU tolerant designs, a DNU puts the latch to a vulnerable state in which the correct state could be lost if the latch experiences a further SEU or DNU before the transparent mode. Additionally, in many of these designs, a DNU moves the output to a high impedance state which implies that the data could discharge if the latch is gated for a sufficient number of cycles. For this reason, there is a need for new designs that are capable of holding the correct output value after a DNU for any number of clock cycles. For discussion purposes, all DNU tolerant designs are classified as either DNU robust or DNU non-robust. A DNU robust design is defined as being capable of resisting further errors and by not allowing any high impedance states after a DNU occurs. A DNU non-robust design is a latch that does not meet the all of stated criteria.

Currently, there are a few existing DNU tolerant designs. The first proposed design found in Katsarou et al., referred to as the DNCS latch, consists of two DICE cells connected to an output Muller C-element. This design tolerates DNU's since each DICE element requires a DNU to flip its state. Since the assumption is that only two errors can occur at once, in the worst case only one DICE element flips its state. Due to the C-element, the latch output does not change value. This design has been shown to be very resilient to DNUs at a very high cost of area, delay and power. Others have proposed an enhanced design compared to Katsarou et al. Their latch design consists of six 2 input C-elements connected in series which are then fed into a 3 input C-element. Like the DNCS latch, this design offers high resiliency to DNUs, however the power consumption and area overheads are still very high.

More recently, a highly area and power efficient design has been proposed in Yan et al. and is referred to as the HSMUF latch. FIG. 1 illustrates the design. The HSMUF latch uses the TP-DICE structure which consists of 6 cross-coupled elements. In the case of a DNU, if the error is on an adjacent node, such as a strike on n1 and n2, the TP-DICE element will fully recover the previous state. However, if the strike occurs on two nonadjacent nodes, the TP-DICE will not fully recover leaving one output node with an erroneous value, one node at high impedance and the remaining output node held at the error free value. To provide reliability, the three nodes are connected to a C-element, as in FIG. 1, which allows the correct value to be held at the latch output.

While all of the previously discussed designs do provide high DNU reliability, none of them are classified as DNU robust since a DNU will result in high impedance states on the internal and output nodes. If an error occurs after a DNU, these latch designs will flip their held value. A popular remedy to this issue is to place a weak keeper on the latch output as in FIG. 1. However, adding a weak keeper greatly increases the power, area and delay overheads since the output C-element must be re-sized so that the C-element's driving strength exceeds that of the keeper. According to our simulations discussed in the Detailed Description, the addition of the keeper to the HSMUF latch nearly triples the power consumption and delay. Additionally, the latch is still vulnerable to error after a DNU since the TP-DICE is in a high impedance state.

The existing most efficient DNU robust design capable of recovering all nodes after a DNU is the DONUT latch as described in Eftaxiopoulos et al. and shown in FIG. 2. The design, as proposed in their paper, uses only 36 transistors, but has a much higher power consumption compared to the HSMUF. The reason for the high power consumption is due to contention on the input lines during the transparent mode. For example, if we observe node n2 in FIG. 2 during the transparent mode, the node is driven by three cross-coupled elements. This contention will increase the amount of time required to change the node thus drastically increasing the dynamic power consumption. To optimize their design, the 48 transistor DONUT-M latch is created in which each component connected to an input node is modified, as shown in FIG. 3 so that the line is at high impedance for the whole duration of the transparent mode. This, in effect, removes the data contention problem thus reducing the overall dynamic power and delay.

It is with these observations in mind, among others, that various aspects of the present disclosure were conceived and developed.

BRIEF DESCRIPTION OF THE DRAWINGS

The foregoing and other objects, features, and advantages of the present disclosure set forth herein should be apparent from the following description of particular embodiments of those inventive concepts, as illustrated in the accompanying drawings. Also, in the drawings the like reference characters refer to the same parts throughout the different views. The drawings depict only typical embodiments of the present disclosure and, therefore, are not to be considered limiting in scope.

Corresponding reference characters indicate corresponding elements among the view of the drawings. The headings used in the FIG.s do not limit the scope of the claims.

DETAILED DESCRIPTION

Figure 1:
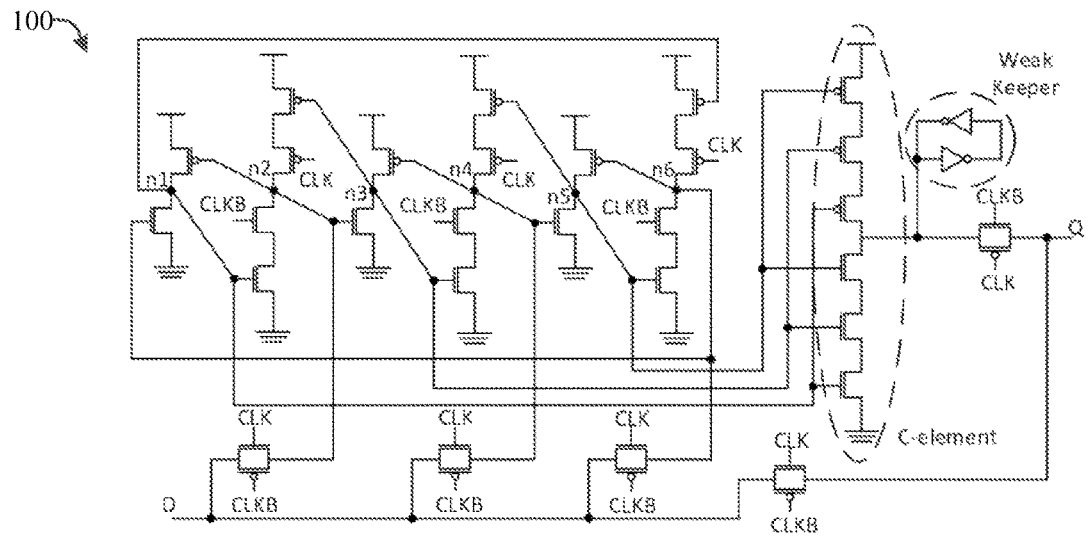
FIG. 1 is an illustration of a prior art HSMUF latch with a weak keeper on the output, according to aspects of the present disclosure.
Figure 2:
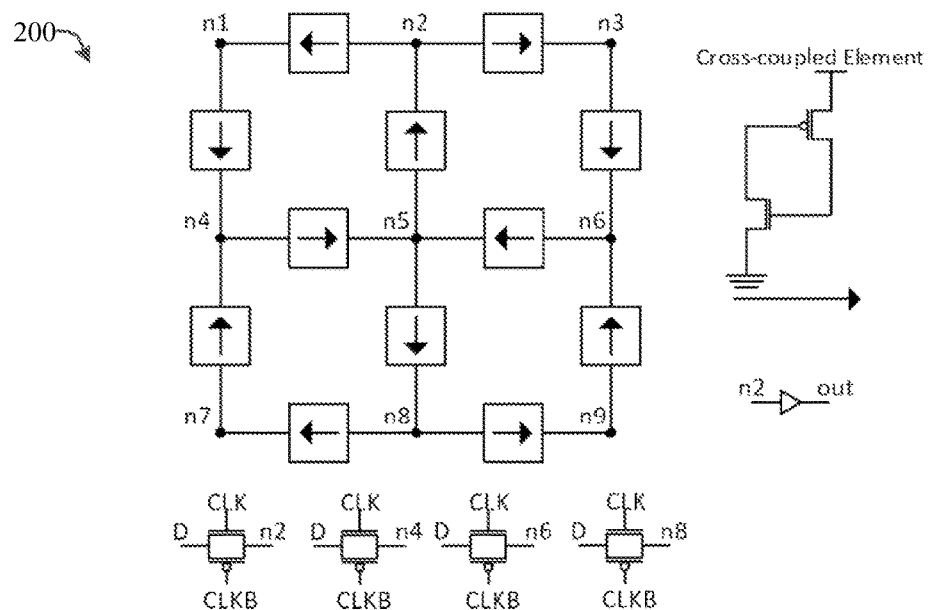
FIG. 2 is an illustration of a prior art DONUT latch, according to aspects of the present disclosure.
Figure 3:
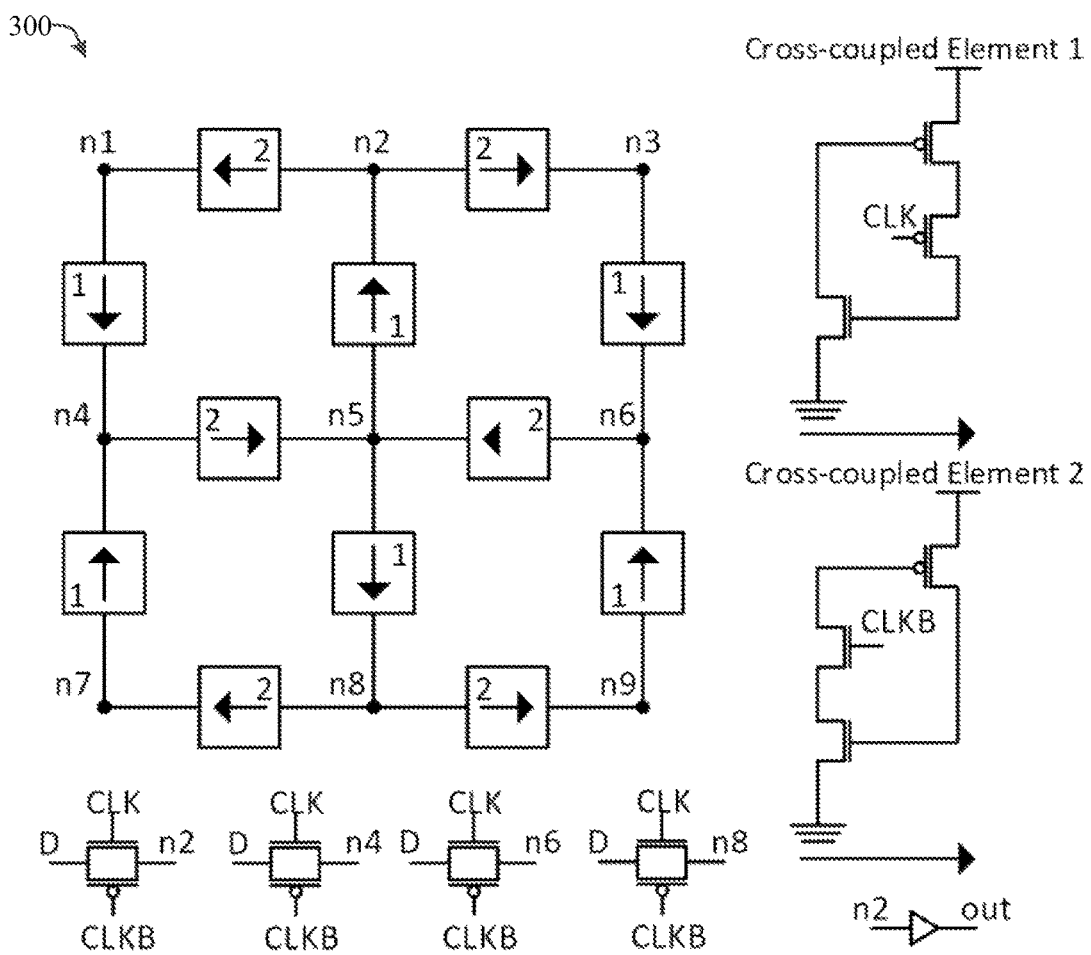
FIG. 3 is an illustration of a prior art modified low-power DONUT latch, according to aspects of the present disclosure.

The present invention includes a DNU robust latch where the implementation is based on three cross connected storage loops connected to three C-elements. The basic design of the storage loop is given in FIG. 4. The data loop is based on the standard latch design with a 3-input C-element inserted to replace one of the inverters. The purpose of the C-element is to separate the feedback loop so that an error will not be held. Additionally, a PMOS is connected to the positive clock signal (CLK) and a NMOS is connected to the negative clock signal (CLKB) to remove contention when data is loaded to the latch. As in the modified DONUT latch of FIG. 3, the addition of these transistors drastically reduces the delay and power consumption.

Figure 4:
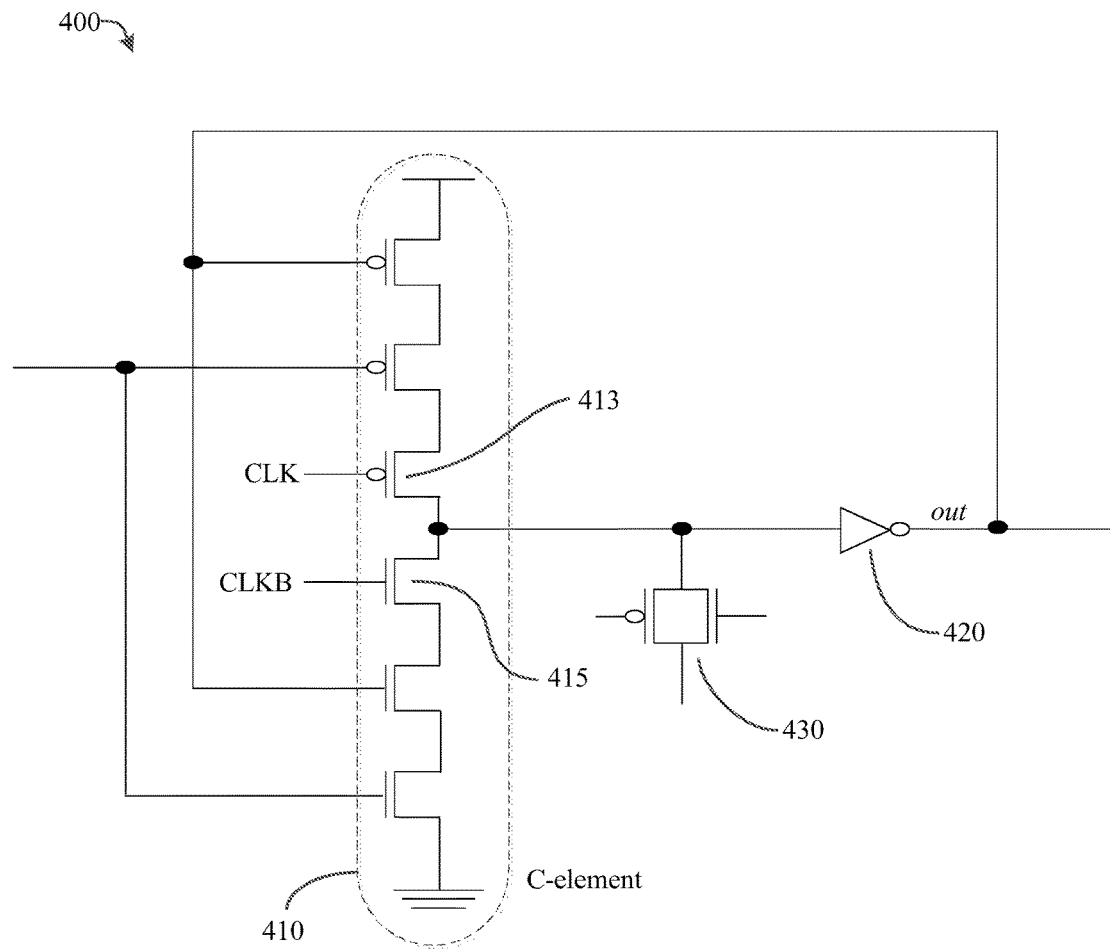
FIG. 4 is an illustration of a basic data storage loop block, according to aspects of the present disclosure.
Figure 5:
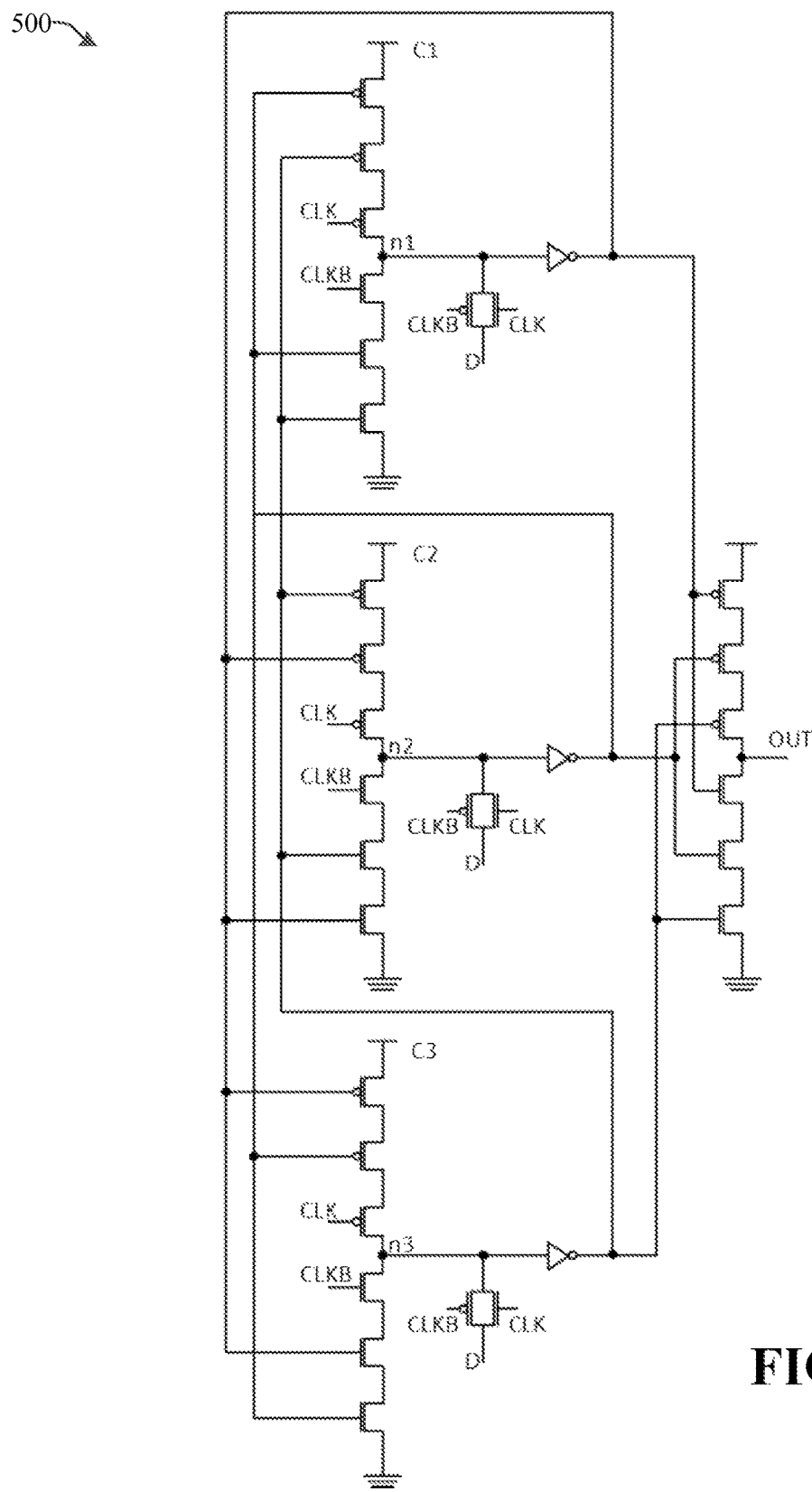
FIG. 5 is a schematic of a block-based latch, according to aspects of the present disclosure.

The block based latch as in FIG. 5 was constructed using the basic storage block. The block based latch was designed with the goal of ensuring that none of the nodes directly drove itself. For example, as shown in FIG. 4 the node out is fed into the input of the 3-input C-element. If an error strikes node out, the cell will never be able to recover its previous state since one of the C-element inputs will be held to an erroneous value by its output. To prevent this issue, the DNU robust latch is based on cross-connecting three of the storage loop blocks so that the C-element is driven by three separate block outputs. In FIG. 5 illustrates a latch design using this idea. If a single error occurs on any node in this design, the circuit is capable fully recovering the previous data.

To demonstrate this, consider a strike on node n2. When the strike occurs, the erroneous value will be propagated to the C-elements driving nodes n1 and n3. However, since there is no change on n1 or n3, the C-elements C1 and C3 will hold their previous value thus preventing the error from propagating to the output. Additionally, since node n2 is driven by nodes n1 and n3, n2 will completely recover the correct state.

Figure 7:
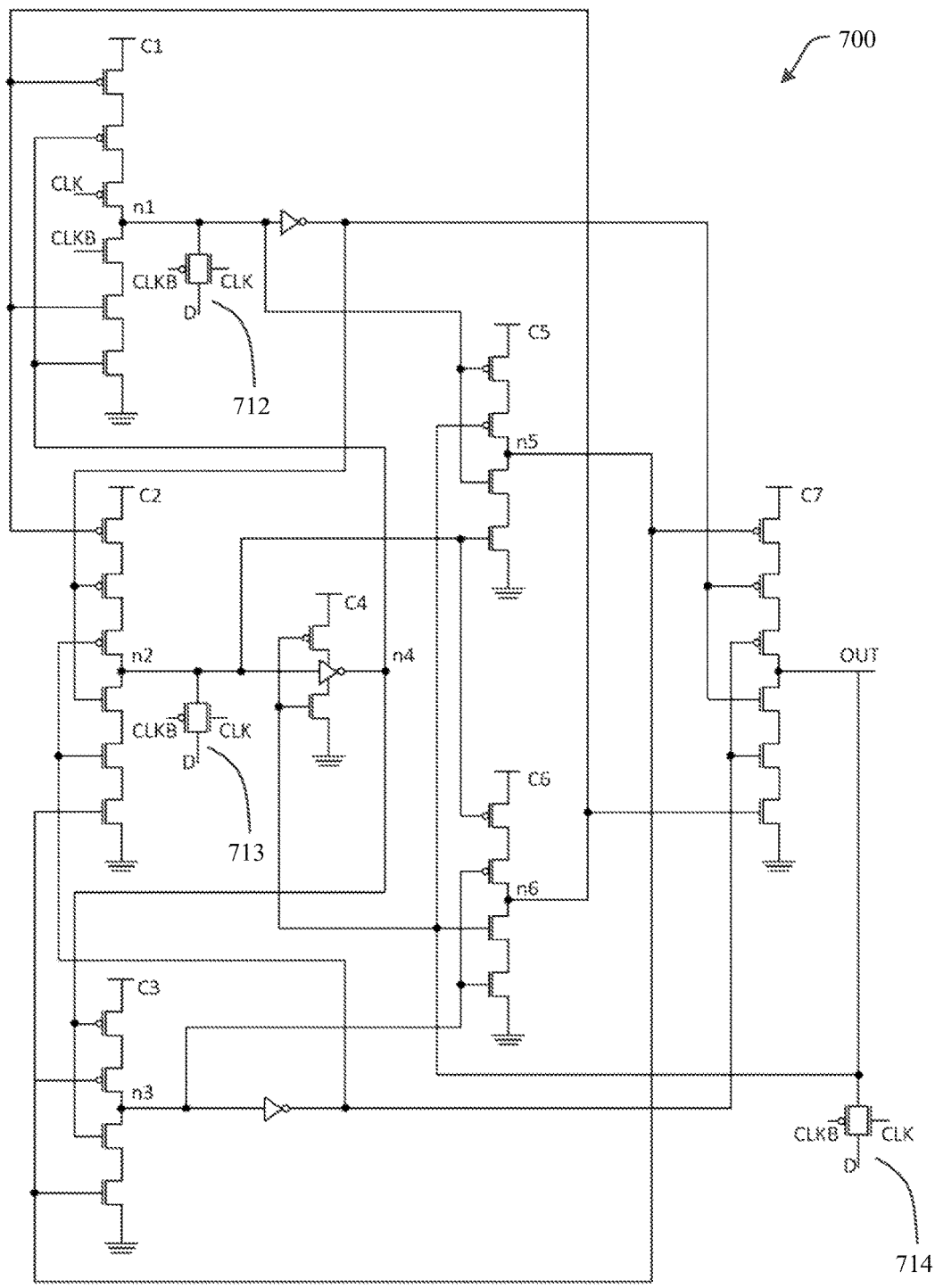
FIG. 7 is a schematic of the HRDNUT latch, according to aspects of the present disclosure.
Figure 9:
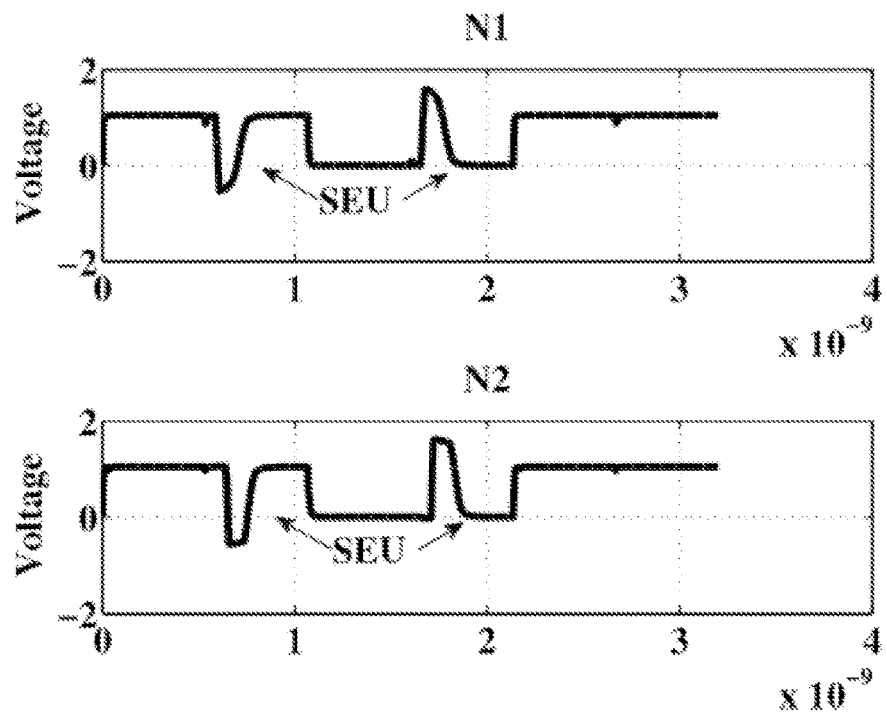
FIG. 9 is a node pair n1 and n2 upset and recovery, according to aspects of the present disclosure.
Figure 10:
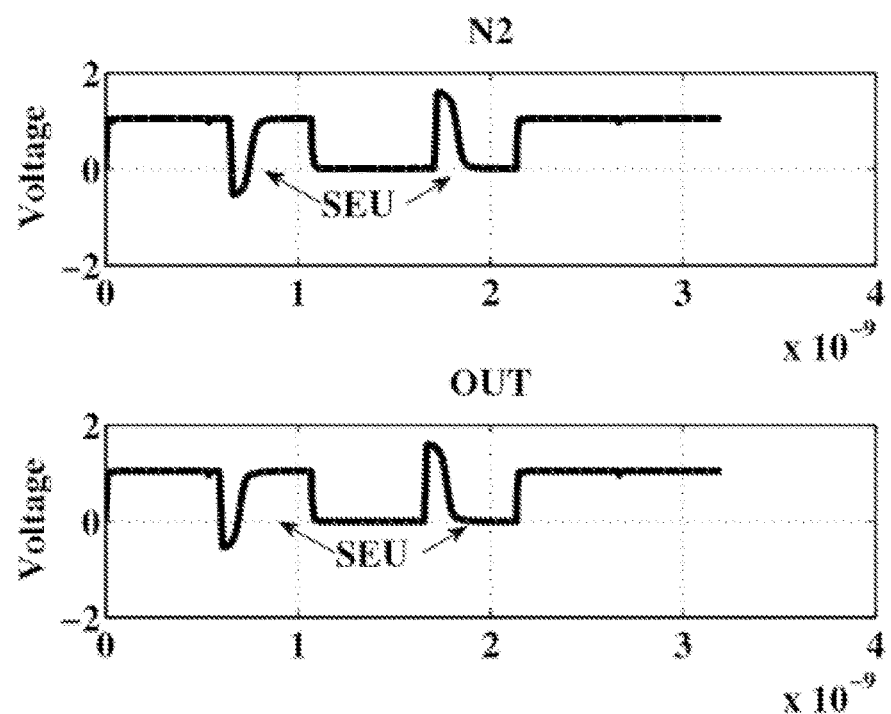
FIG. 10 is a node pair n2 and out upset and recovery, according to aspects of the present disclosure.
Figure 11:
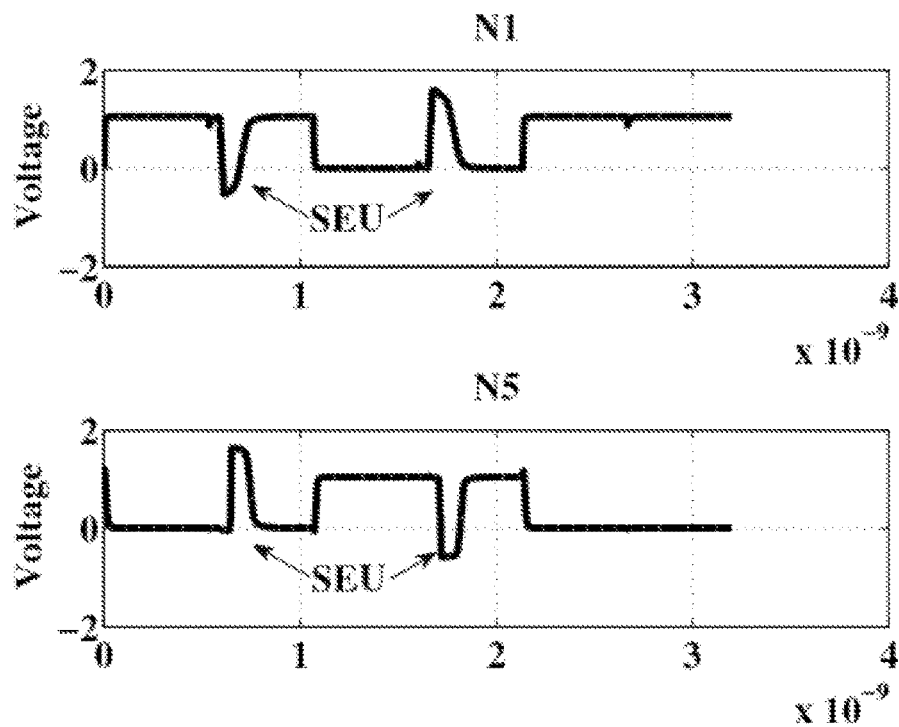
FIG. 11 is a node pair n1 and n5 upset and recovery, according to aspects of the present disclosure.
Figure 12:
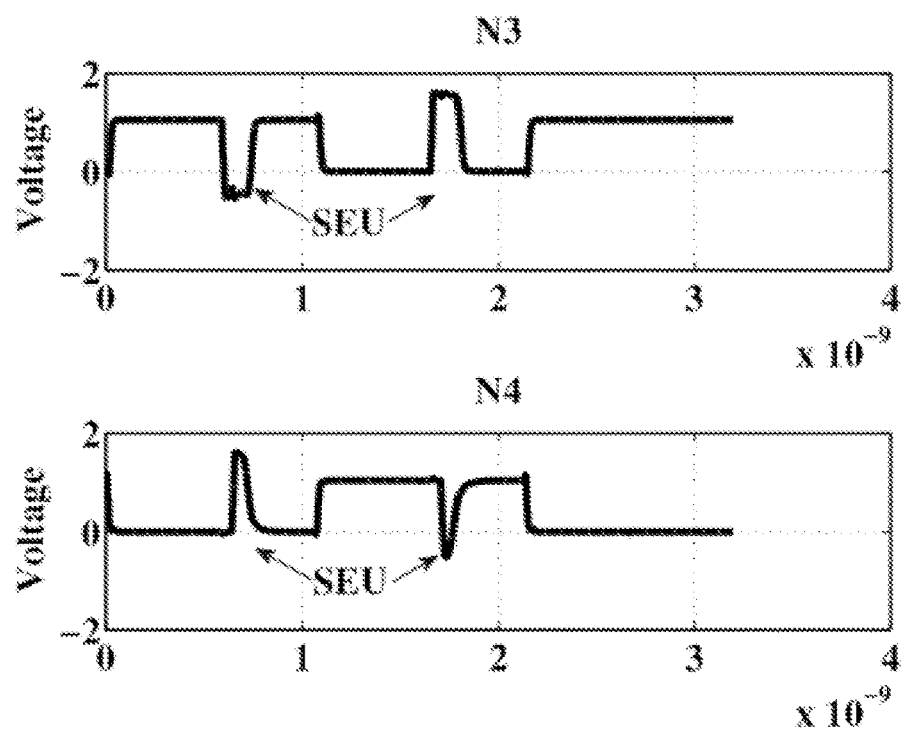
FIG. 12 is a node pair n3 and n4 upset and recovery, according to aspects of the present disclosure.
Figure 13:
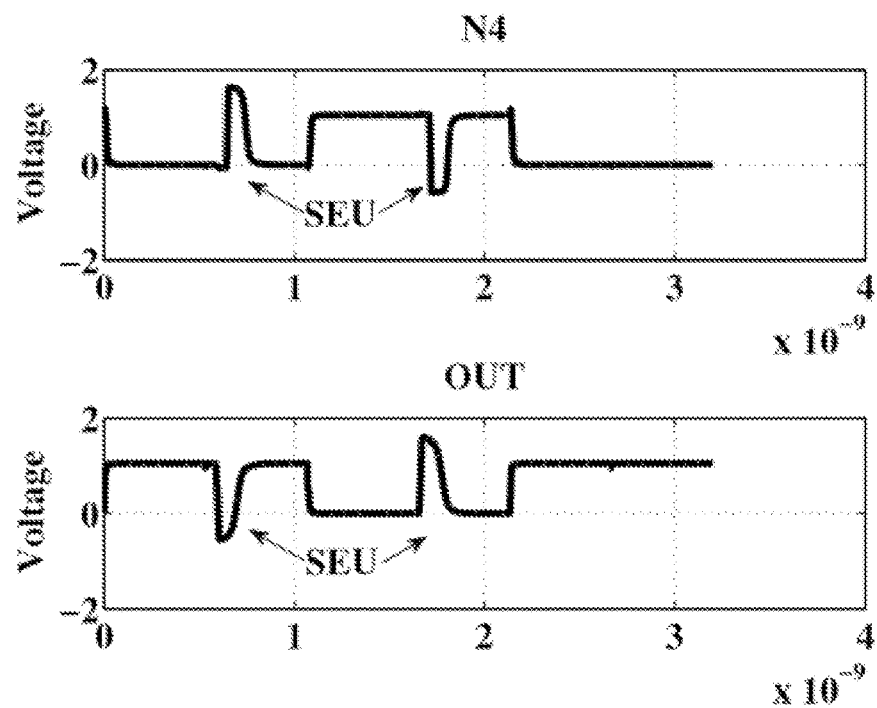
FIG. 13 is a node pair n4 and out upset and recovery, according to aspects of the present disclosure.
Figure 14:
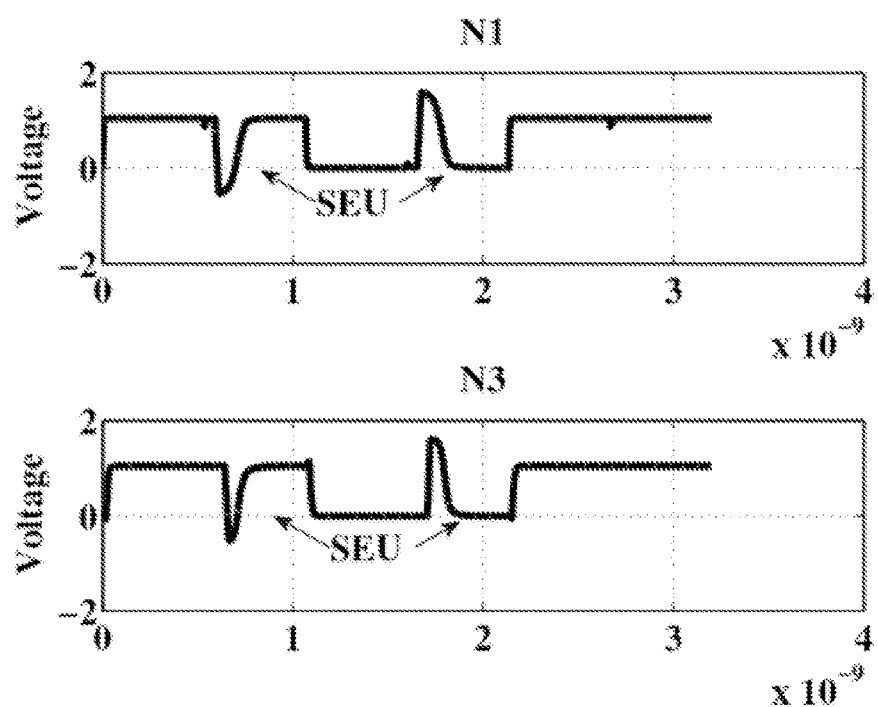
FIG. 14 is a node pair n1 and n3 upset and recovery, according to aspects of the present disclosure.
Figure 15:
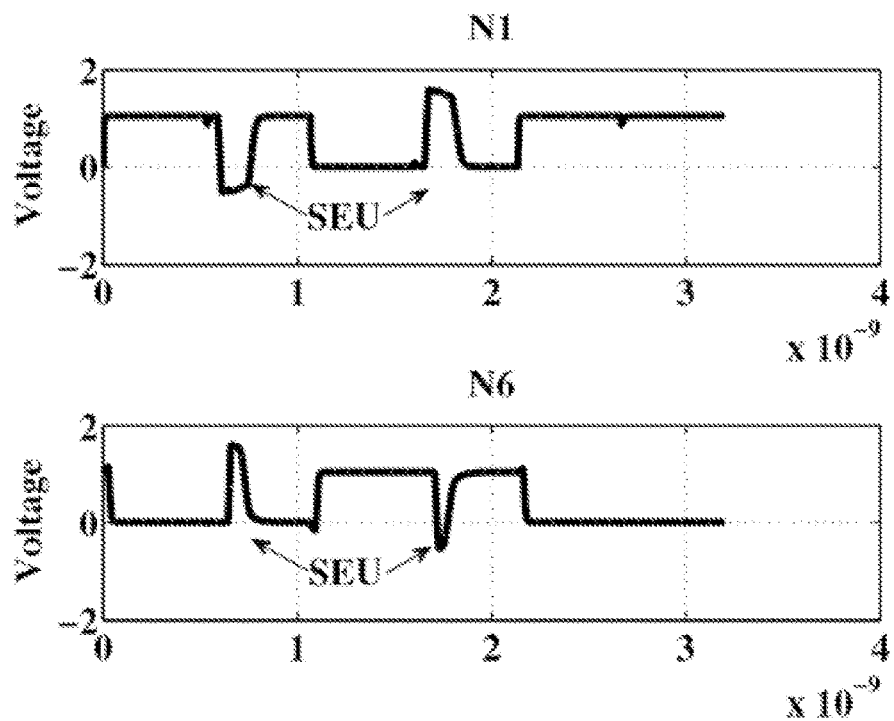
FIG. 15 is a node pair n1 and n6 upset and recovery, according to aspects of the present disclosure.
Figure 16:
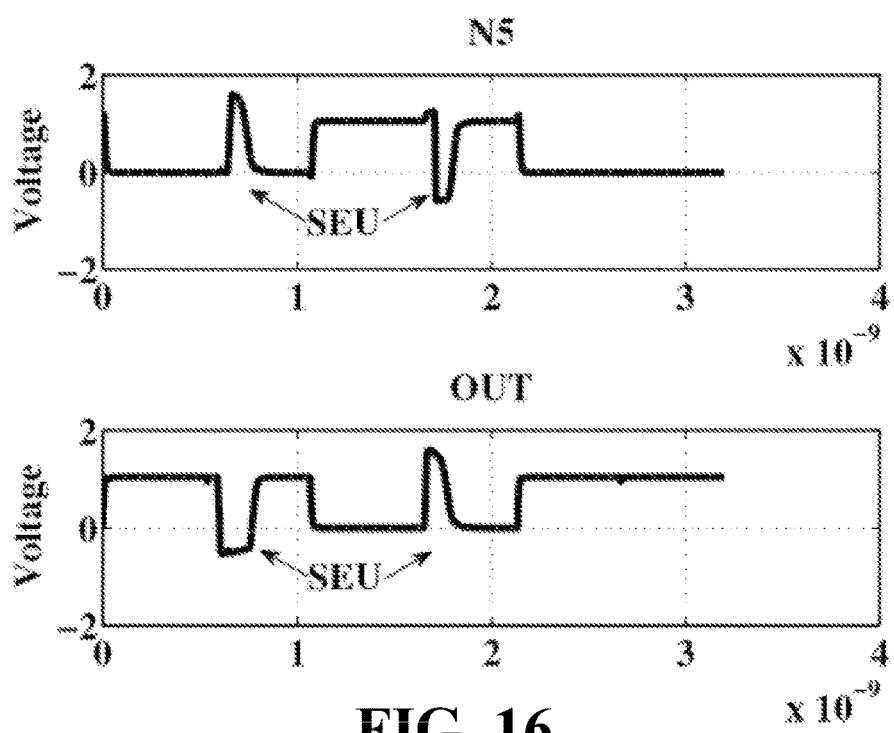
FIG. 16 is a node pair n5 and out upset and recovery, according to aspects of the present disclosure.
Figure 17:
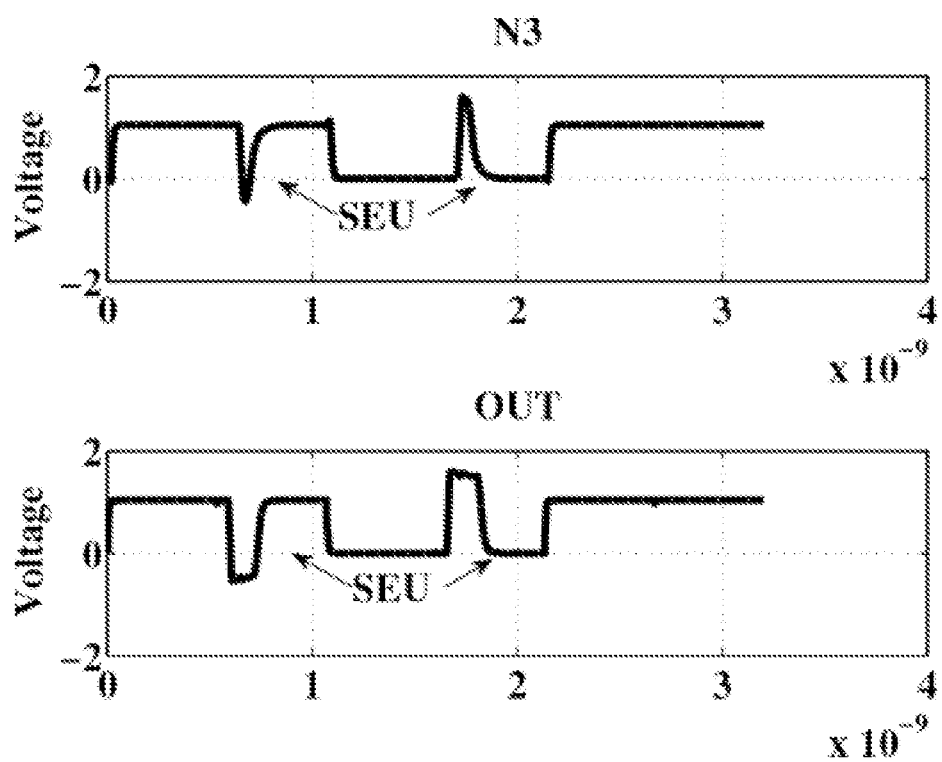
FIG. 17 is a node pair n3 and out upset and recovery, according to aspects of the present disclosure.

A problem, however, with the latch design shown in FIG. 5 is that it is not capable of tolerating DNUs. For example, if an error occurs on nodes n1 and n2 the erroneous values will propagate to the inputs of C-element C3 and flip the value of n3 thus changing the output value. However, since the latch has recovery capability for SEUs, it is modified so it can tolerate DNUs and recover all nodes to the previous state. The proposed HRDNUT latch schematic is illustrated in FIG. 7. The design uses the block-based latch in FIG. 5 as a base and adds additional C-elements to prevent errors from being held by the data loop.

Figure 6:
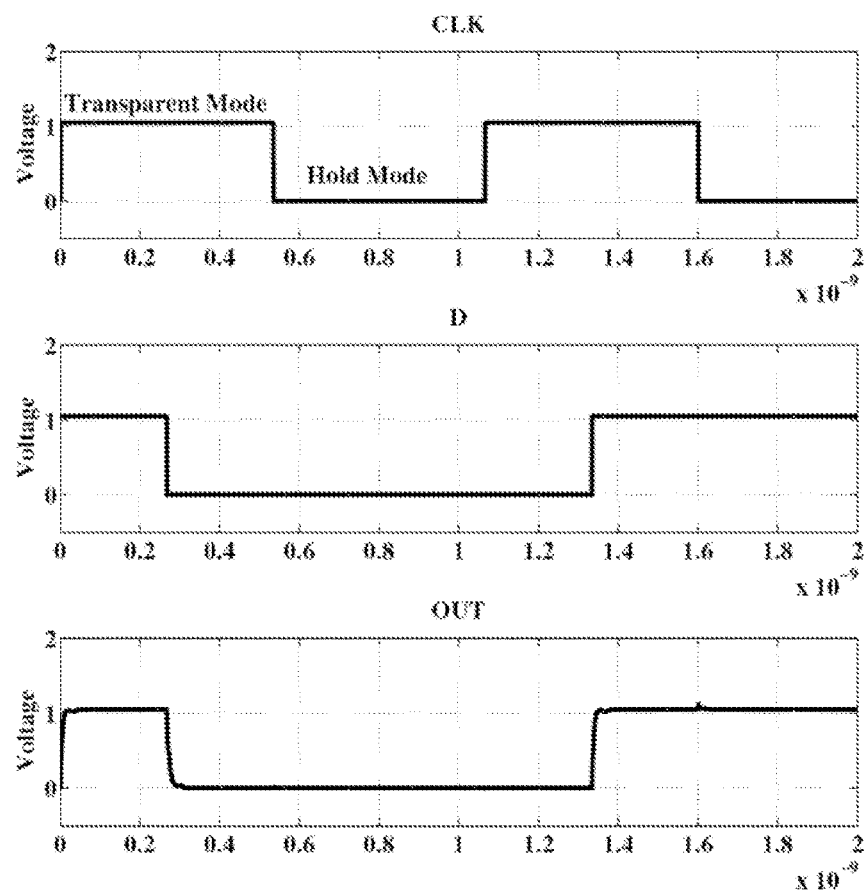
FIG. 6 is an illustration of the waveforms of a HRDNUT latch during normal operation, according to aspects of the present disclosure.
Figure 8:
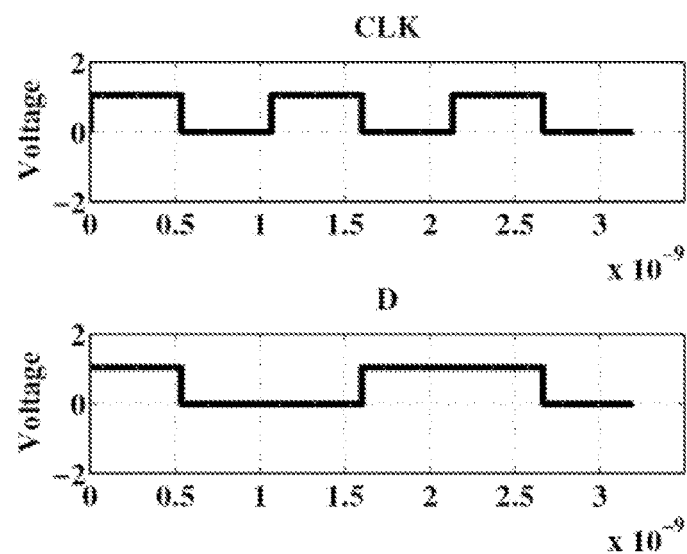
FIG. 8 is an illustration of the waveforms for CLK and D, according to aspects of the present disclosure.

Initially, the HRDNUT latch is evaluated during normal operation. When the positive clock signal (CLK) has a high value and the negative clock signal (CLKB) has a low value, the HRDNUT latch is in transparent mode. At this stage, the transistors connected to the clock signal in C-element C1 deactivate the PMOS and NMOS stacks thus causing the node n1 to be in a high impedance state. This, in effect, reduces data contention thus reducing delay and dynamic power consumption. Next, the data is loaded through the pass gates connected to nodes n1, n22 and out. Since the output node out is loaded directly, the data to out delay is minimized and all nodes are set to their respective error free values. When CLK changes to a low value and CLKB to a high value, the latch moves into the hold mode. In this stage, the pass gates are deactivated and the state of the HRDNUT latch is held since each node is driven to the correct value using a C-element. FIG. 6 provides the waveforms of the CLK, D and OUT nodes for both the transparent and hold modes of operation.

In the case of an SEU, the HRDNUT retains the excellent resiliency of the block based latch and the ability to recover every node after an error. In the case of any internal node being struck by an error, the latch will not change value due to all internal C-elements requiring at least 2 identical input values to change values. In the case of an error hitting the output node out, the latch fully recovers since out does not directly drive C-element C7.

Lastly, the latch in the case of a DNU is evaluated. Note that unless otherwise stated, it is assumed that the analysis applies to both when D=0 and D=1. For our analysis, the possible DNU strike combinations were categorized into 9 distinct cases based on their effect in the HRDNUT latch. The categories are discussed in greater detail below.

Consider strikes at nodes n1 and n2. In this case, the error at n1 will propagate to C-elements C5 and C7 but will not cause a flip since the error at n2 will be blocked by C-element C4. Additionally, since the inputs of C-elements C1 and C2 are unchanged, the nodes will recover their initial values. This analysis can be applied to node combinations containing node n2 except for the combination with node out since the error will be blocked by C-element C4.

In the case of a DNU upsetting nodes n2 and out, the error at n2 will propagate through C-element C4. However, C-elements C1 and C3 will block the error and nodes n1, n3, n5 and n6 will hold their values thus driving node out to the correct state.

Consider when a DNU strikes nodes n1 and n5. In this case, the error at n1 hits the output of C-element C1 which is propagated to C7. The error on n5 is also propagated to C-element C7. Since node n3 and the inputs of C-elements C1 and C5 are unaffected by an error, the output retains the error-free value and the HRDNUT latch fully recovers the previous state. The above analysis also applies to the node combination (n3, n6).

In the case of a DNU hitting nodes n3 and n4, the error at n4 is propagated to C-element C3 and the error at n3 is propagated to C7 and C6. After the error on n3 subsides, C4 will drive node n4 and, due to the connection at C3, node n3 back to the error-free value. The node combination (n1, n1) can be analyzed similarly. For the node combinations of (n4, n5) and (n4, n6), the latch will also recover the previous result since the inputs to C4 are unchanged. This implies that after the error occurs at n4, the node will be driven back to the correct value thus also driving the nodes n5 or n6 back to the correct value.

When a DNU upsets the combination of n4 and out, the error at out is propagated to C4, C5 and C6 and the error at n4 to C1 and C3. Since none of the inputs to C7 are changed by the error, out is flipped back to its error-free value which drives n4 through C4 back to its previous state.

Consider when a DNU strikes nodes n1 and n3 being struck. In this case, the errors are propagated to C elements C2, C5, C6 and C7. However, since the errors do not manifest into an error on any other node, the latch fully recovers from the error.

When a DNU strikes the nodes n1 and n6. The error at node n6 propagates to C1 and C7 while the error at n1 also propagates to C7. Due to the error-free node n3 driving C7, the previous value is held at the output by C7. Additionally, n3 will drive C6 back to its previous value thus driving C1 back to the error free state. This analysis can be applied similarly to the node combination of (n3, n5).

In the case where a DNU strikes nodes n5 and out the error at n5 propagates to C7, C2 and C3 and the error at out goes to C4, a PMOS in C5 and a NMOS in C6. When the error-free value at out is 1, the value at n5 is 0. The error at the nodes change the values to 0 and 1 respectively and the erroneous value at out is propagated to the PMOS at C5 and the NMOS at C6. This, in effect, causes the PMOS at C5 to be activated and the NMOS at C6 to be deactivated. However, since nodes n1 and n2 remain error-free, the NMOS stack of C5 will drive n5 back to the correct value. This, in turn, forces C7 to also drive out back to the error-free value. In the case where out has an ideal value of 0, the error will be fully recovered since the NMOS stack will be entirely driven by fault-free nodes. The above analysis can be applied to the node combination of (n6, out).

Finally, the node combinations (n1, out), (n3, out) and (n5, n6) are analyzed. In these cases the errors do not cause a change on the inputs of any C-elements driving the node thus the previous value will always be recovered.

SIMULATION RESULTS

The HRDNUT latch was implemented using the 1.05V 32 nm PTM library as described by Zhao et al. and simulated in HSPICE. All transistors were set to the minimum size with the PMOS widths set to W=80 nm and the NMOS widths set to W=40 nm. To evaluate the DNU reliability of the design, current pulses were injected for every possible error combination. The injection current was calculated using the equation found in Ziegler. The equation is given below with $\tau$ as the technology dependent constant, $Q_o$ as the injection current value and t as the variable for time.

$$I(t) = \frac{2Q_o}{\tau\sqrt{\pi}} \sqrt{\frac{t}{\tau}} e^{\frac{-t}{\tau}} \quad (1)$$

Using equation (1) $\tau$ was set to $32\times10^{-12}$ and $Q_o$ was set to 5fC. In all simulations, the latch was operated at a frequency of 1 Ghz. In FIGS. 8-17, the waveforms for each case are presented and discussed above and show that the HRDNUT is fully capable of recovering all nodes in the presence of a DNU.

Next, the HRDNUT latch was compared to existing SEU and DNU tolerant methods. As in the HRDNUT latch, all latches were designed using the 32 nm PTM library and operated at 1 Ghz. For the analysis, HRDNUT latch is compared to the following SEU tolerant latches: DICE, FERST and HIPER. Additionally, HRDNUT latch was also compared to the following DNU tolerant designs: DNCS, Interception, HSMUF and DONUT. All transistors for the implemented latches were set to minimum width and length except for the designs that use a C-element with a weak keeper. In these designs the C-element's PMOS width was set to W=320 nm and the NMOS width was set to W=160 nm and the weak keeper was sized to be at minimum width. The C-element was sized so that the output driving strength did not allow the keeper to drive an erroneous value in the event of an error.

To provide a fair comparison, the propagation delay, average power consumption and area of all designs are measured and categorized based on whether the designs can tolerate a DNU and if the designs are robust from error after a DNU occurs. The delay was measured as the time between when a transition occurs on input D to when a transition was observed on the output. The average power was computed using the error-free operation for each latch for a duration of 200 ns. To compare the area overhead, the unit size transistor (UST) metric was adopted as in Katsarou et al., which represents the number of unit sized (minimum width is W=40 nm in this case) transistors required for the design. Table I below provides the results of these simulations.

TABLE I

SPICE Simulations of Existing Latches using the 1.05 V 32 nm PTM library

| Latch | DNU Immune | DNU Robust | Power (μW) | Delay (ps) | Area (UST) |
|---|---|---|---|---|---|
| DICE | No | No | 1.332 | 8.145 | 16 |
| FERST | No | No | 3.178 | 31.648 | 60 |
| HIPER | No | No | 1.292 | 2.221 | 27 |
| DNCS | Yes | No | 4.948 | 22.486 | 61 |
| [10] | Yes | No | 5.606 | 79.168 | 89 |
| HSMUF | Yes | No | 1.871 | 1.0626 | 51 |
| HSMUF (Keeper) | Yes | No | 3.787 | 3.945 | 78 |
| DONUT | Yes | Yes | 4.021 | 14.722 | 54 |
| DONUT-M | Yes | Yes | 2.760 | 8.421 | 72 |
| HRDNUT Latch | Yes | Yes | 2.450 | 2.310 | 66 |

According to Table I the only DNU robust designs are the two DONUT latch implementations and the HRDNUT latch. Compared to the modified DONUT latch, the HRDNUT latch provides DNU robustness while reducing the power consumption and number of transistors by 11.3% and 8.33% respectively while also reducing the delay by 72.5%. For the above reasons, the HRDNUT latch is the best design for clock gating applications due to its high robustness, even after a DNU occurs, and lower power, delay and area overheads.

CONCLUSION

The HRDNUT latch discussed herein is suited for clock gating schemes. Since clock gating may require the latch to remain in a hold state for many clock cycles, the susceptibility of error increases. In many existing designs, a DNU may either change the state of the latch or push the latch into a state were the output may discharge over time due to a high impedance state. A common method to solve this problem is the addition of a weak keeper on the output. As shown and discussed above, the addition of the keeper causes much higher power consumption. Since the HRDNUT latch does not stay in a high impedance state after a DNU, the HRDNUT provides high reliability during the whole duration of the hold mode while providing the lowest delay, power and area compared to other latches suitable for clock gating. Simulation results show that the HRDNUT latch is 11.3% more power efficient while requiring 8% less transistors and 72.5% less delay compared to the highly robust DONUT latch.

What is claimed is:

1. A double node upset (DNU) tolerant latch circuit comprising:
    a first storage circuit (C1) and a second storage circuit (C2), each comprising three inputs and an output;
    a third storage circuit (C3) and a fourth storage circuit (C4), each comprising two inputs and an output;
    wherein the output of the first storage circuit (C1) is electrically connected to an input of the second storage circuit (C2); the output of the second storage circuit (C2) is electrically connected to the fourth storage circuit (C4); the output of the third storage circuit (C3) is electrically connected to an input of the second storage circuit (C2); and the output of the fourth storage circuit (C4) is electrically connected to an input of the first storage circuit (C1) and an input of the third storage circuit (C3).

2. The DNU tolerant latch circuit of claim 1, further comprising:
    a voting circuit, the voting circuit comprising:
        a first voting element circuit (C5) and a second voting element circuit (C6), each comprising two inputs and an output; and
        a third voting element circuit (C7) comprising three inputs and an output, wherein the output of the third voting element circuit (C7) is the output of the DNU tolerant latch circuit.

3. The DNU tolerant latch circuit of claim 2, wherein:
    the output of the first voting element circuit (C5) is electrically connected to an NMOS transistor of the second storage circuit (C2), an input of the third storage circuit (C3), and a PMOS of the third voting element circuit (C7).

4. The DNU tolerant latch circuit of claim 3, wherein:
    the output of the second voting element circuit (C6) is electrically connected to an input of the first storage circuit (C1), a PMOS transistor of the second storage circuit (C2), and an NMOS transistor of the third voting element circuit (C7).

5. The DNU tolerant latch circuit of claim 4, wherein:
    the output of the third voting element circuit (C7) is electrically connected to an input of the fourth storage circuit (C4), a PMOS transistor of the first voting element circuit (C5), and an NMOS transistor of the second voting element circuit (C6).

6. The DNU tolerant latch circuit of claim 2, wherein:
    the output of the first storage circuit (C1) is further electrically connected to an input of the first voting element circuit (C5) and an input of the third voting element circuit (C7).

7. The DNU tolerant latch circuit of claim 6, wherein the output of the second storage circuit (C2) is further electrically connected to an NMOS transistor of the first voting element circuit (C5), and a PMOS transistor of the second voting element circuit (C6).

8. The DNU tolerant latch circuit of claim 7, wherein the output of the third storage circuit (C3) is further electrically connected to an input of the second voting element circuit (C6), and an input of the third voting element circuit (C7).

9. The DNU tolerant latch circuit of claim 2, wherein:
    the first voting element circuit (C5) and the second voting element circuit (C6) each comprise a two-input C-element circuit; and
    the third voting element circuit (C7) comprises a three-input C-element circuit.

10. The DNU tolerant latch circuit of claim 2, further comprising:
    a first inverter coupled between the output of the first storage circuit (C1) and an input of the third voting element circuit (C7); and a second inverter coupled between the output of the third storage circuit (C3) and inputs of the second storage circuit (C2) and the third voting element circuit (C7).

11. The DNU tolerant latch circuit of claim 1, wherein: the first storage circuit (C1) and the second storage circuit (C2) each comprise a three-input C-element circuit; and the third storage circuit (C3) and the fourth storage circuit (C4) each comprise a two-input C-element circuit.

12. The DNU tolerant latch circuit of claim 1, wherein an input of the first storage circuit (C1) is electrically connected to a clock signal.

13. A method for preventing double node upsets (DNUs) in a latch circuit, the method comprising:
electrically interconnecting:
a first storage circuit (C1) and a second storage circuit (C2), each comprising three inputs and an output; and
a third storage circuit (C3) and a fourth storage circuit (C4), each comprising two inputs and an output;
wherein the output of the first storage circuit (C1) is electrically connected to an input of the second storage circuit (C2); the output of the second storage circuit (C2) is electrically connected to the fourth storage circuit (C4); the output of the third storage circuit (C3) is electrically connected to an input of the second storage circuit (C2); and the output of the fourth storage circuit (C4) is electrically connected to an input of the first storage circuit (C1) and an input of the third storage circuit (C3).

14. The method of claim 13, further comprising electrically interconnecting a voting circuit, wherein the voting circuit comprises:
a first voting element circuit (C5) and a second voting element circuit (C6), each comprising two inputs and an output; and
a third voting element circuit (C7) comprising three inputs and an output, wherein the output of the third voting element circuit (C7) is the output of the latch circuit.

15. The method of claim 14, wherein:
the output of the first voting element circuit (C5) is electrically connected to an NMOS transistor of the second storage circuit (C2), an input of the third storage circuit (C3), and a PMOS of the third voting element circuit (C7).

16. The method of claim 15, wherein:
the output of the second voting element circuit (C6) is electrically connected to an input of the first storage circuit (C1), a PMOS transistor of the second storage circuit (C2), and an NMOS transistor of the third voting element circuit (C7).

17. The method of claim 16, wherein:
the output of the third voting element circuit (C7) is electrically connected to an input of the fourth storage circuit (C4), a PMOS transistor of the first voting element circuit (C5), and an NMOS transistor of the second voting element circuit (C6).

18. The method of claim 14, wherein:
the output of the first storage circuit (C1) is further electrically connected to an input of the first voting element circuit (C5) and an input of the third voting element circuit (C7);
the output of the second storage circuit (C2) is further electrically connected to an NMOS transistor of the first voting element circuit (C5), and a PMOS transistor of the second voting element circuit (C6); and
the output of the third storage circuit (C3) is further electrically connected to an input of the second voting element circuit (C6), and an input of the third voting element circuit (C7).

19. The method of claim 14, wherein:
the first storage circuit (C1) and the second storage circuit (C2) each comprise a three-input C-element circuit;
the third storage circuit (C3) and the fourth storage circuit (C4) each comprise a two-input C-element circuit;
the first voting element circuit (C5) and the second voting element circuit (C6) each comprise a two-input C-element circuit; and
the third voting element circuit (C7) comprises a three-input C-element circuit.

20. The method of claim 14, further comprising:
electrically interconnecting:
a first inverter between the output of the first storage circuit (C1) and an input of the third voting element circuit (C7); and
a second inverter between the output of the third storage circuit (C3) and inputs of the second storage circuit (C2) and the third voting element circuit (C7).

* * * * *